(12) United States Patent
Domae

(10) Patent No.: US 7,544,549 B2
(45) Date of Patent: Jun. 9, 2009

(54) METHOD FOR MANUFACTURING SEMICONDUCTOR DEVICE AND MOS FIELD EFFECT TRANSISTOR

(75) Inventor: Yasuhiro Domae, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 287 days.

(21) Appl. No.: 11/443,357

(22) Filed: May 31, 2006

(65) Prior Publication Data
US 2006/0270125 A1 Nov. 30, 2006

(30) Foreign Application Priority Data
May 31, 2005 (JP) .............................. 2005-160175

(51) Int. Cl.
*H01L 21/84* (2006.01)
(52) U.S. Cl. .................. 438/162; 438/149; 438/151; 438/154; 438/163; 438/164; 438/166; 438/520; 438/528
(58) Field of Classification Search .............. 438/149, 438/151, 154, 162–164, 166, 520, 528
See application file for complete search history.

(56) References Cited
U.S. PATENT DOCUMENTS 5,917,219 A * 6/1999 Nandakumar et al. ....... 257/348
6,169,000 B1 * 1/2001 Ohkubo ...................... 438/289
6,210,998 B1 * 4/2001 Son ............................. 438/162
6,479,868 B1 * 11/2002 An et al. ..................... 257/348
6,667,517 B1 12/2003 Yamazaki
6,770,517 B2 8/2004 Nakauka et al.
2002/0058361 A1 * 5/2002 Nakaoka et al. ............. 438/149

FOREIGN PATENT DOCUMENTS

JP 11-74538 3/1999
JP 2001-326361 11/2001

* cited by examiner

*Primary Examiner*—Kevin M Picardat
*Assistant Examiner*—Bac H Au
(74) *Attorney, Agent, or Firm*—Volentine & Whitt, P.L.L.C.

(57) ABSTRACT

Upon manufacture of a semiconductor device provided with a source region and a drain region formed by activating, through anneal, an n-type first dopant ion-implanted in a p-type device forming area provided in a semiconductor layer formed on an insulator, and a body region, (a) ion implantation of Ar in a boundary region between the source and drain regions to be formed, which corresponds to a region lying in a predeterminate area for forming the body region, and (b) high-temperature anneal for partly recovering crystal defects produced by the ion implantation of the Ar at a temperature higher than the anneal for activation of the first dopant are carried out prior to the ion-implantation of the first dopant.

14 Claims, 6 Drawing Sheets

METHOD FOR MANUFACTURING SEMICONDUCTOR DEVICE AND MOS FIELD EFFECT TRANSISTOR

BACKGROUND OF THE INVENTION

The present invention relates to a method for manufacturing a semiconductor device formed in a semiconductor layer provided on an insulator, and a MOS field effect transistor formed in a semiconductor layer provided on an insulator.

There has heretofore been known a so-called SOI integrated circuit wherein an elemental device such as a transistor is formed in a silicon semiconductor layer by using an SOI (Silicon On Insulator) substrate in which the silicon semiconductor layer is laminated on an insulator.

The SOI integrated circuit is superior to an integrated circuit (hereinafter called "silicon integrated circuit") formed in a single silicon substrate in that, for example, (1) it is small in parasitic capacitance and excellent in high-speed performance, (2) it is resistant to soft errors, (3) no latch up occurs and (4) a well process can be omitted.

In the SOI integrated circuit, particularly, a MOS field effect transistor (hereinafter called "SOI-MOSFET") formed in an SOI substrate, the SOI-MOSFET is placed in a state of being electrically isolated by field oxide films for device isolation, and an insulator that constitutes the SOI substrate. Therefore, holes generated by collisions (impact ionization) between electrons accelerated by an electric filed in the vicinity of a drain region and lattice atoms are stored in a channel region. Described more specifically, the holes are not able to escape to a source region due to an energy barrier between the source region and the channel region, thus resulting in the storage thereof in the channel region. Various phenomena generated by storage of the holes in the channel region are called "floating body effects".

As one of the floating body effects, may be mentioned, single latch up. The single latch up means that the potential of the channel region rises due to the storage of the holes, so that the source region, the channel region and the drain region apparently operate as a bipolar transistor. The single latch up causes an increase in current that flows through the channel region, thus resulting in the occurrence of a reduction in drain breakdown voltage of the SOI-MOSFET. Problems such as the single latch up, the reduction in the drain breakdown voltage with the latch up, etc. come to the fore where the voltage applied to the drain region is high.

In order to solve these problems with the floating body effects, there has been known a prior art wherein Ar ions or the like are implanted in a source region and a drain region to artificially form crystal defects in a silicon semiconductor layer, and the crystal defects are constituted as recombination centers of holes (refer to, for example, a patent document 1 (Japanese Unexamined Patent Publication No. Hei 11(1999)-74538 (FIG. 4), and a patent document 2 (Japanese Unexamined Patent Publication No. 2001-326361 (FIG. 2)).

The methods for introducing the crystal defects in the silicon semiconductor layers respectively, which have been disclosed in these patent documents 1 and 2, are capable of effectively suppressing the floating body effects. With the recent miniaturization of a semiconductor device, however, a new problem also arises with derivation from the crystal defects.

The new problem resides in an increase in off-leakage current of the SOI-MOSFET. Here, the off-leakage current indicates a current which flows between the source region and the drain region when the voltage applied to its gate is 0V, the source region is grounded and a predetermined voltage is applied to the drain region.

The cause of the increase in the off-leakage current resides in that a thermal treatment temperature for activating dopants with the miniaturization of each SOI-MOSFET is rendered lower than ever.

The increase in the off-leakage current of the SOI-MOSFET will be explained below.

When the gate length the SOI-MOSFET is reduced, a short channel effect occurs. The short channel effect means a phenomenon in which the influence of an electric field in the drain region is exerted even upon the source region so that the threshold voltage of the field effect transistor is reduced.

In order to suppress the short channel effect, it is effective to hold long a channel length corresponding to an interval between the source region and the drain region. To this end, there is a tendency to lower an anneal temperature for activating dopants introduced into a source forming predeterminate area or region and a drain forming predeterminate area. That is, the diffusion of the dopants in a gate-length direction is suppressed by execution of anneal at the low temperature. As a result, a channel length simply necessary for the suppression of the short channel effect can be ensured.

When, however, the anneal temperature is lowered, crystal defects derived from ion implantation of Ar are not recovered sufficiently, and a large number of crystal defects remain in the silicon semiconductor layer. As result, a current leaks between the source regions and the drain region through the crystal defects in the SOI-MOSFET. That is, the off-leakage current increases.

In order to solve such a problem, the present inventors have carried out investigations and experiments diligently and have found clues to the solution of the problem.

Figure 6:
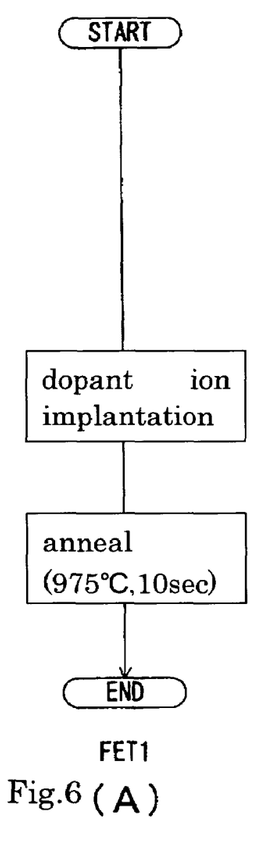
FIG. 6 is a view showing flowcharts illustrative of major process steps in processes for manufacturing conventional SOI-MOSFETs.
Figure 7:
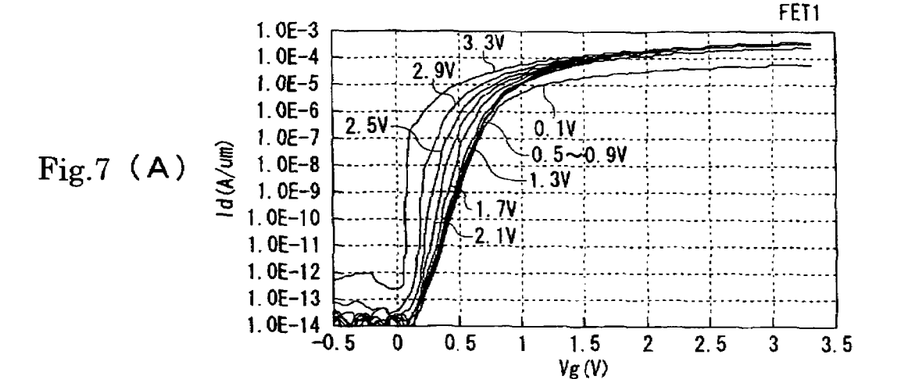
FIG. 7 is a view illustrating characteristics of the conventional SOI-MOSFETs.

Results (FIGS. 6 and 7) of experiments carried out by the present inventors are shown below, and the problem of the above SOI-MOSFET will be explained in further detail. Here, FIG. 6 is a view showing flowcharts illustrative of major process steps in processes for manufacturing SOI-MOSFETs employed in the present experiments. FIG. 7 is a view showing the characteristics of the SOI-MOSFETs employed in the present experiments.

Upon execution of the present experiments, three types of SOI-MOSFETs shown below were manufactured by varying manufacturing process steps.

The SOI-MOSFET (hereafter called "FET1") shown in FIG. 6(A) is fabricated by the known method except that anneal for activating dopants ion-implanted in a source forming predeterminate area and a drain forming predeterminate area is carried out at a temperature (975° C. for 10 seconds) lower than ever (about 1050° C. for 10 seconds). Incidentally, the ion implantation of Ar for suppressing a floating body effect is not effected on the FET1.

The SOI-MOSFET (hereinafter called "FET2") shown in FIG. 6(B) is manufactured by a method similar to the FET1 except that after the ion implantation of Ar and the ion implantation of the dopants, once anneal (975° C. for 10 seconds) is carried out. That is, the FET2 simultaneously performs the recovery of crystal defects derived from the Ar ion-implantation and the activation of the dopants at the above once anneal. Here, Ar ion-implantation conditions for the FET2 are as follows: implantation rate: $2 \times 10^{14}$ cm$^{-2}$ and implantation energy: 30 keV.

The SOI-MOSFET (hereinafter called "FET3") shown in FIG. 6(C) is different from the FET2 in that the ion-implantation rate of Ar is smaller than that at the FET2. Here, Ar ion-implantation conditions for the FET3 are as follows: implantation rate: $5×10^{13}$ cm$^{-2}$ and implantation energy: 30 keV.

Even in the case of any of FET1 through FET3, its gate length is 0.35 μm.

In FIG. 7, any of the vertical axes shows a drain current Id(A) per gate width 1 μm, and any of the horizontal axes in FIG. 7 shows a gate voltage Vg(V). Nine graphs drawn in FIGS. 7(A) through 7(C) respectively correspond to different drain voltages Vd(V). Although shown even in the figures, the drain voltages Vd are varied at 0.4V intervals from 0.1V to 3.3V.

As shown in FIG. 7(A), the respective graphs are spaced away from one another in FET1. When the graphs are respectively seen on the whole, their transverse widths become wide. This results from floating body effects. Now consider a difference $ΔVg$ ($=Vg_{max}-Vg_{min}$) between the maximum value $Vg_{max}$ of a gate voltage Vg at Id=0.1 μA and its minimum value $Vg_{min}$ as an index indicative of the transverse width of the entire graph, i.e., an index indicative of the magnitude of the floating body effect. From the graph of Vd=0.1V, $Vg_{max}$ can be read as about 0.7V. Similarly, $Vg_{min}$ can be read as about 0.1V from the graph of Vd=3.3V. Thus, $ΔVg$ results in about 0.6V (=0.7−0.1).

On the other hand, as shown in FIG. 7(B), the transverse widths of the respective graphs become narrow as compared with FET1 on the whole in the case of FET2 subjected to the ion implantation of Ar. $ΔVg$ at FET2 is about 0.3V and is narrowed by about 0.3V in width as compared with FET1. This means that crystal defects derived from the ion implantation of Ar function as recombination centers of holes, and floating body effects are suppressed.

It is however understood that an off-leakage current $Id_{off}$ (Id at Vg=0V) of FET2 is larger than FET1 on the whole. At Vd=3.3V in particular, an off-leakage current $Id_{off}$ of a few pA or so occurs. This means that in the case of the above anneal (975° C. for 10 seconds), the crystal effects derived from the Ar ion-implantation are not recovered sufficiently, and a current leaks between a source region and a drain region through the crystal defects.

The results up to now are summarized as follows. It is understood that when the anneal temperature is 975° C., the ion implantation of Ar is carried out and in the case of FET2 in which the crystal defects are artificially introduced, the floating body effects are suppressed, whereas the off-leakage current $Id_{off}$ increases.

From this result, the present inventors have considered that the suppression of the floating body effects and the reduction in the off-leakage current can be simultaneously attained if the ion-implantation rate of Ar is decreased to reduce the quantity of the crystal defects introduced into the silicon semiconductor layer, and then have fabricated FET3 in which the implantation rate of Ar ions is reduced, thereby obtaining a result shown in FIG. 7(C).

In the case of FET3 in which the ion-implantation rate of Ar is set to ¼ of FET2, as shown in FIG. 7(C), the maximum value of the off-leakage current $Id_{off}$ ranged from 2 pA to 3 pA (from the graph at Vd=3.3V), and $ΔVg$ indicative of the index of the floating body effect was about 0.5V.

When FET3 and FET2 are compared with each other, the off-leakage current $Id_{off}$ is reduced by a rate commensurate with a decrease in the ion implantation of Ar, whereas the substrate floating effect greatly increases to such a degree as to become near that at FET1.

It has been revealed from this that the mere decrease in the ion-implantation rate of Ar encounters difficulties in simultaneously attaining the suppression of the floating body effects and the reduction in the off-leakage current Idoff.

SUMMARY OF THE INVENTION

The present invention has been made based on the above background. An object of the present invention is therefore to provide a method for manufacturing a semiconductor device, which is capable of simultaneously attaining (1) suppression of floating body effects and (2) a reduction in off-leakage current both placed in a trade-off relationship with respect to each other at practically sufficient levels, and a MOS field effect transistor.

A semiconductor device configured as a MOS field effect transistor to which the present invention can be applied, is provided which has a structure having a source region and a drain region formed by activating, through anneal, a first dopant of other conduction type ion-implanted in a device forming area of one conduction type provided in a semiconductor layer formed over an insulator, and a body region corresponding to the device forming area between the source region and the drain region.

Upon solving the above problem, there is provided a first manufacturing method of the semiconductor device, according to the present invention, which has the feature that the following two processes are executed prior to the ion-implantation of the first dopant of other conduction type. The first process resides in that Ar is ion-implanted in a boundary region between the source and drain regions to be formed, which corresponds to a region lying in a predeterminate area for forming the body region. The second process resides in that high-temperature anneal for recovering crystal defects produced by the ion implantation of the Ar is carried out at a temperature higher than the anneal for activation of the first dopant. The latter anneal is also called "defect recovery anneal" below.

A second manufacturing method of the semiconductor device, according to the present invention is a method in which the first manufacturing method is described more specifically. That is, the second manufacturing method includes the following steps (1) through (3):

(1a) an Ar ion implantation step for ion-implanting Ar with a gate electrode section formed in the surface of the device forming area as a mask to introduce crystal defects into the device forming area, the above step being used as a pre-process for introducing a first dopant of other conduction type into the device forming area of one conduction type, (1b) a high-temperature anneal step for recovering some of the crystal defects, (2) a first ion implantation step for ion-implanting the first dopant of other conduction type with the gate electrode section as a mask, and (3) an activation step for performing anneal for activation of the first dopant at a temperature lower than the high-temperature anneal to thereby form a source region and a drain region in the device forming area.

A MOS field effect transistor of the present invention comprises field oxide films which electrically isolate the individual MOS field effect transistors from one another, each of which is formed in a device forming area of one conduction type provided in a semiconductor layer formed over an insulator, a gate electrode section in which a gate oxide film and a gate electrode formed over the surface of the device forming area demarcated by the field oxide films are laminated in this order, a source region and a drain region each having other conduction type, which are formed on both sides of a region demarcated by the field oxide films with the gate electrode section interposed therebetween, a body region corresponding to the device forming area between the source region and the drain region, and crystal defects artificially introduced into an end on the source region side, of the body region and an end thereof on the drain region side.

The MOS field effect transistor is characterized in that its gate length ranges from 0.32 µm to 0.35 µm, and the magnitude of an off-leakage current $Id_{off}$ flowing between the source region and the drain region at the time that the voltage Vg applied to the gate electrode is 0V, the voltage Vd applied to the drain region is 3.3V and the source region is grounded, is 1 pA or less, and that Vg (0.1) – Vg (3.3) at the time that the Vg is Vg (0.1) where the Vd is 0.1V and the Id is 0.1 µA and that the Vg is Vg (3.3) where the Vd is 3.3V and the Id is 0.1 µA, is 0.4V or less.

The MOS field effect transistor of the present invention has the feature that the off-leakage current $Id_{off}$ is less than or equal to 1 pA, and Vg(0.1) – Vg(3.3) indicative of an index for a floating body effect is less than or equal to 0.4V.

According to the first and second manufacturing methods of the semiconductor device according to the present invention referred to above, some of the crystal defects introduced into the device forming area by ion implantation of Ar are recovered by the high-temperature anneal, and thereafter the ion implantation of the first dopant and the anneal for activation of the first dopant are carried out. Thus, the semiconductor device is obtained wherein the crystal defects are introduced into the end on the source region side, of the body region and the end on the drain region side, of the body region as recombination centers.

That is, in the present invention, the recovery of some of the crystal defects and the activation of the first dopant both of which have heretofore been simultaneously performed at one anneal, are respectively carried out in discrete process steps (high-temperature anneal and anneal). Thus, since the first dopant is not yet introduced in the device forming area at the stage of execution of the high-temperature anneal for recovery of some of the crystal defects, there is no fear of excessive diffusion of the first dopant along a gate-length direction, and the high-temperature anneal can be carried out at the optimum temperature (temperature higher than an anneal temperature for activation of the first dopant, to be described later) for recovering some of the crystal defects.

At the stage of execution of the anneal for activation of the first dopant, the crystal defects have already been recovered by the high-temperature anneal. Therefore, anneal can be performed at the optimum temperature (temperature lower than the above high-temperature anneal temperature) enabling the activation of the first dopant while the excessive diffusion of the first dopant along the gate-length direction is being suppressed, without taking into consideration the recovery of the crystal defects. Thus, according to the manufacturing method of the semiconductor device according to the present invention, there can be provided a semiconductor device which simultaneously attains (1) suppression of floating body effects and (2) a reduction in off-leakage current at practically sufficient levels.

The MOS field effect transistor of the present invention attains (1) the suppression of floating body effects and a reduction in off-leakage current simultaneously at the practically sufficient levels while a short channel effect is being suppressed, regardless of the provision of the crystal defects defined as the recombination centers artificially introduced in the body region.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings. The shape, size and layout relationship of each constituent element in the figures are merely approximate illustrations to enable an understanding of the present invention. While preferred configurational examples of the present invention are explained below, the material and numerical conditions of each constituent element, etc. are nothing more than mere preferred examples. Accordingly, the present invention is by no means limited to an embodiment to be described below.

Figure 1:
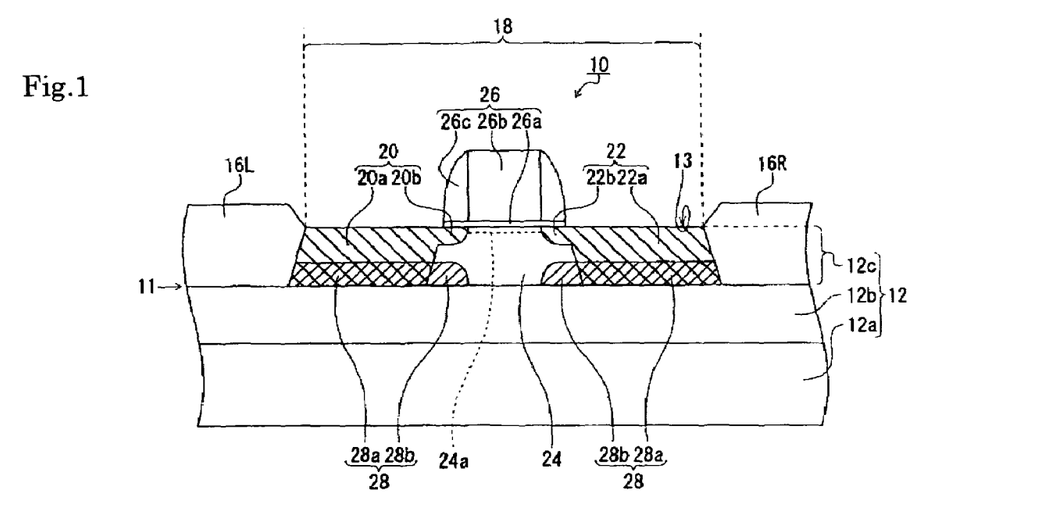
FIG. 1 is a sectional view schematically showing a configuration of a semiconductor device according to an embodiment.
Figure 4:
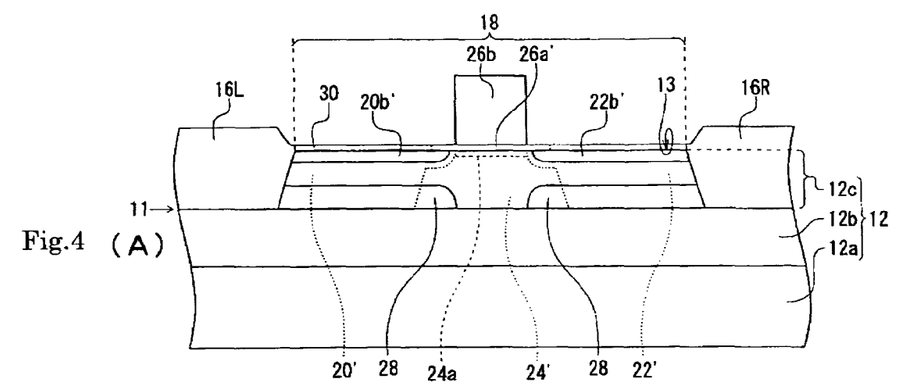
FIG. 4 is a process sectional view depicting extracted major process steps of the method for manufacturing the semiconductor device according to the embodiment shown in FIG. 1.
Figure 5:
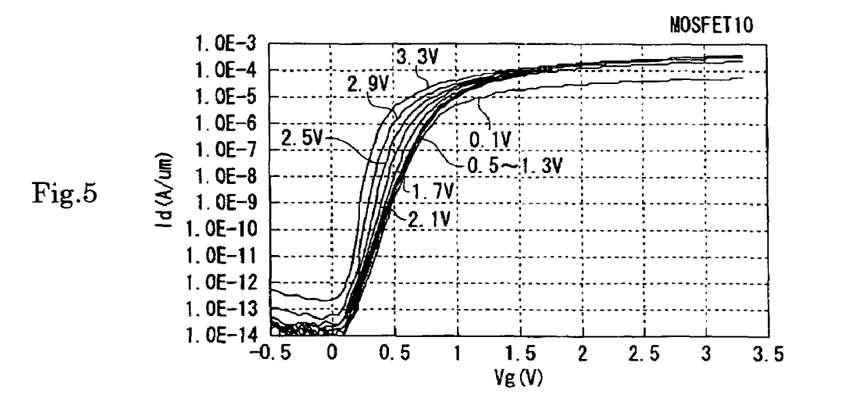
FIG. 5 is a view used to describe operative effects of the semiconductor device according to the embodiment shown in FIG. 1 and its manufacturing method.

FIG. 1 is a view showing a cut area of a cross-section showing a schematic configuration of a semiconductor device according to the present embodiment. FIGS. 2(A), 2(B) and 2(C) are respectively views showing cut areas of cross-sections of such structures as obtained in major process steps of a method for manufacturing the semiconductor device according to the embodiment. FIGS. 3(A), 3(B) and 3(C) are respectively views showing cut areas of cross-sections of such structures as obtained in major process steps following FIG. 2(C). FIGS. 4(A), 4(B) and 4(C) are respectively views showing cut areas of cross-sections of such structures as obtained in major process steps following FIG. 3(C). FIG. 5 is a view used to describe operative effects of the semiconductor device according to the present embodiment and the method of manufacturing the semiconductor device.

In FIGS. 1 through 4, common constituent elements are given the same reference numerals, and the description thereof is omitted as appropriate.

FIG. 1 is a view showing one configurational example of the semiconductor device to which the present invention is applicable. A MOSFET 10 configured as the semiconductor device formed in a substrate 12 shown in FIG. 1 is a so-called n channel type MOSFET, wherein a source region 20, a drain region 22, a body region 24, a gate electrode section 26 and Ar ion-implanted regions 28, etc. are provided in a device forming region or area 18 partitioned by field oxide films 16L and 16R.

The substrate 12 is a so-called SOI substrate, which includes a base or bed substrate 12a, an $SiO_2$ layer 12b corresponding to an insulator, which is laminated on the base substrate 12a, and a semiconductor layer 12c laminated on the $SiO_2$ layer 12b. Here, a boundary surface between the $SiO_2$ layer and the semiconductor layer 12c is referred to as an interface 11. The surface of the semiconductor layer 12c, i.e., a surface relative to the interface 11 is called a main surface 13. Incidentally, the base substrate 12a and the semiconductor layer 12c are preferably configured as Si, for example. The thickness of the $SiO_2$ layer 12b may preferably be 200 nm, for example.

Although the field oxide films are shown as two regions 16L and 16R in FIG. 1, they are actually formed as one continuous oxide film. The MOSFET 10 is formed in the device forming area 18 surrounded by the oxide film. Thus, the field oxide films 16L and 16R electrically separate the MOSFET 10 from other elements adjacent thereto. The field oxide films 16L and 16R may preferably be formed of, for example, $SiO_2$. The field oxide films 16L and 16R are formed by oxidizing the semiconductor layer 12c over its entire thickness in a predetermined region. That is, each of the field oxide films 16L and 16R has a thickness extending from the main surface 13 of the semiconductor layer 12c to the interface 11 between the semiconductor layer 12c and the $SiO_2$ layer 12b.

As described above, the device forming area 18 corresponds to an area for the semiconductor layer 12c surrounded by the field oxide films 16L and 16R. The MOSFET 10 is formed in the device forming area 18. While the thickness of the device forming area 18 is set to, preferably, for example, 40 nm, it can be set to an arbitrary and suitable thickness corresponding to design in a range from 30 nm to 70 nm. In the present embodiment, a conduction type of the device forming area 18 is defined as one conduction type, for example, a p type. Incidentally, the conduction type of the device forming area 18 is an item selected according to the design of the semiconductor device. That is, the conduction type of the device forming area 18 may preferably be set to an n type where the MOSFET 10 is of a p channel type (p-MOS), whereas when the MOSFET 10 is of an n channel type (n-MOS), it may preferably be set to a p type.

The gate electrode section 26 is provided at a predetermined spot in the main surface 13 of the device forming area 18. The gate electrode section 26 has a gate oxide film 26a, a gate electrode 26b and sidewalls 26c.

The gate oxide film 26a is formed of an $SiO_2$ film whose thickness is about 7 nm, and is provided in contact with the main surface 13 of the device forming area 18. The gate electrode 26b formed of polysilicon whose thickness is about 150 nm, is provided on the gate oxide film 26a.

The gate oxide film 26a has a length extending in a gate-length direction (horizontal direction as viewed in FIG. 1), which is larger (longer) than that of the gate electrode 26b. The gate electrode 26b is provided in the neighborhood of the center of the gate oxide film 26a. Accordingly, regions uncovered with the gate electrode 26b exist at both ends in the gate-length direction of the gate oxide film 26a. The sidewalls 26c are provided in the regions uncovered with the gate electrode 26b so as to cover sidewalls of the gate electrode 26b. The sidewalls 26c may preferably be formed of, for example, $SiO_2$. Incidentally, the gate-length direction indicates a direction that extends along the direction in which carriers are moved in a channel region 24a to be described later.

The source region 20 is a region in the device forming area 18, which is provided between the gate electrode 26b and the field oxide film 16L. The source region 20 includes layers of other conduction type, i.e., an $n^+$ layer 20a and an $n^-$ layer 20b. The $n^+$ layer 20a extends over the entire thickness of the semiconductor layer 12c from an end of the field oxide film 16L to the neighborhood of a lower end on the side of facing the field oxide film 16L, of the gate electrode section 26. The $n^+$ layer 20a is a region in which dopants higher in concentration than the $n^-$ layer 20b are diffused.

The $n^-$ layer 20b is of a so-called LDD (Lightly doped drain) structure. A region on the main surface 13 side, of the semiconductor layer 12c extends so as to jut out in the direction of the drain region 22 from a side end of the gate electrode section 26 with respect to the $n^+$ layer 20a. That is, the $n^-$ layer 20b is in continuation with the side end of the gate electrode section 26 with respect to the $n^+$ layer 20a and extends from the side end of the gate electrode section 26 to the neighborhood of a lower end on the side of facing its side end, of the gate electrode 26b. The $n^-$ layer 20b extends in a region shallower than the $n^+$ layer 20a, and a region placed on the side below the $n^-$ layer 20b, of the semiconductor layer 12c constitutes part of the body region 24.

Although described later in detail, the source region 20 is formed in accordance with the following process steps for the most part (refer to FIGS. 4(A) through 4(C)). That is, (1) an n-type first impurity (e.g., As) is ion-implanted (first time) in a device forming area 18, using a gate electrode 26b as a mask to thereby form a first ion-implanted region 20b' (it will be described later: FIG. 4(A)). (2) An n-type second impurity (e.g., P) is ion-implanted (second time) in the device forming area 18, using a gate electrode section 26 as a mask to thereby form a second ion-implanted region 20a' (it will be described later: FIG. 4(C)). Although the different impurities (As and P) are used as the first and second impurities in this case, the first and second impurities may be identical. (3) The device forming area 18 is annealed to activate the first and second impurities as a first dopant, thereby changing the first and second ion-implanted regions 20b' and 20a' into an $n^-$ layer 20b and an $n^+$ layer 20a respectively. As is apparent from these process steps, each of the $n^-$ layer 20b and the $n^+$ layer 20a has a conduction type opposite to the conduction type (p type) of the device forming area 18.

Incidentally, each of the first impurity and the second impurity is the next higher classifying concept of the first dopant here. When the first dopant is taken in the form of plural types, the first and second impurities are terms used to distinguish these types from one another.

The drain region 22 is a region provided between the gate electrode 26b of the device forming region 18 and the field oxide film 16R. The drain region 22 includes an $n^+$ layer 22a and an $n^-$ layer 22b. The drain region 22 take a structure similar to the source region 20 referred to above and has a shape symmetric with respect to the source region 20 with the gate electrode 26b interposed therebetween. As is well known, the source and drain regions 20 and 22 are normally simultaneously formed. Thus, the detailed description of the $n^+$ layer 22a and $n^-$ layer 22b in the drain region 22 will be omitted.

The body region 24 is a region in the device forming area 18 between the source region 20 and the drain region 22. The body region 24 includes a channel region 24a. The channel region 24a is a region placed directly below the gate electrode 26b in the vicinity on the main surface 13 side, of the body region 24. A dopant (e.g., B) of the same conduction type as the device forming area 18 (p type) is introduced in the channel region 24a and activated to adjust the threshold voltage of the MOSFET 10.

The Ar ion-implanted regions 28 are respectively formed over the entire surface of the source region 20 of the device forming area 18 and the entire surface of the drain region 22 thereof. That is, each Ar ion-implanted region 28 is substantially in the same shape as each of the source region 20 and the drain region 22 as viewed in the plane.

Each Ar ion-implanted region 28 is a region in which a crystal defect derived from the ion implantation of Ar exists in the device forming area 18. Although described later in detail, Ar is ion-implanted astride the source and drain regions and part of the body region 24. As a result, the Ar ion-implanted regions 28 respectively extend on both sides where the Ar ion-implanted region 28 straddles the boundary between the source region 20 and the body region 24 and on both sides where the Ar ion-implanted region 28 straddle the boundary between the drain region 22 and the body region 24. That is, the crystal defect regions 28b are regions in the body region 24. Further, they can be said to be artificially crystal defect-introduced regions by ion-implanting Ar in a boundary region between the source and drain regions 20 and 22 to be formed.

Here, regions in which the Ar ion-implanted regions 28 overlap with the source and drain regions 20 and 22, are called "overlap regions 28a". Regions in which the body region 24 overlaps with the Ar ion-implanted regions 28, are called "crystal defect regions 28b".

The configuration of the Ar ion-implanted region 28 will be explained below with the region on the source region 20 side as an example.

The overlap region 28a extends in the vicinity of the interface 11 of the device forming area 18 so as to be superimposed on the n+ layer 20a.

The crystal defect region 28b extends so as to jut out in the drain region 22 direction from the end below the gate electrode section 26, of the overlap region 28a in the body region 24. That is, the crystal defect region 28b extends in continuation with the overlap region 28a and juts into part of the body region 24 astride the boundary between the n+ layer 20a of the source region 20 and the body region 24. The length of the crystal defect region 28b which juts in the drain region 22 direction is the same degree as the n− layer 20b of the source region 20.

Incidentally, the Ar ion-implanted region 28 extending to the drain region 22 side has a structure symmetric with respect to that of the Ar ion-implanted region 28 extending to the source region 20 side with the gate electrode 26b interposed therebetween. Thus, the detailed description of the Ar ion-implanted region 28 on the drain region 22 side will be omitted.

Although described later in detail, the Ar ion-implanted regions 28 are formed by ion-implanting Ar in the source and drain regions 20 and 22 with the gate electrode 26b as a mask at such implantation energy that the concentration of Ar becomes maximum at the semiconductor layer 12c in the neighborhood of the interface 11 between the $SiO_2$ layer 12b and the semiconductor layer 12c and thereafter performing high-temperature anneal, i.e., defect recovery anneal at a temperature higher than an anneal temperature for activation of the first dopant in the source and drain regions 20 and 22. Incidentally, the high-temperature anneal is carried out prior to the execution of introduction of the first and second impurities (As and P) into the source and drain regions 20 and 22.

With the ion implantation of Ar, a large number of crystal defects are introduced into the Ar ion-implanted regions 28. Some of the crystal defects are recovered by subsequent high-temperature anneal. Of the crystal defects that remain in the semiconductor layer 12c without their recovery, ones that exist in the crystal defect regions 28b function as recombination centers of holes generated by impact ionization upon the operation of the MOSFET 10 and reduce a substrate floating effect of the MOSFET 10.

Figure 2:
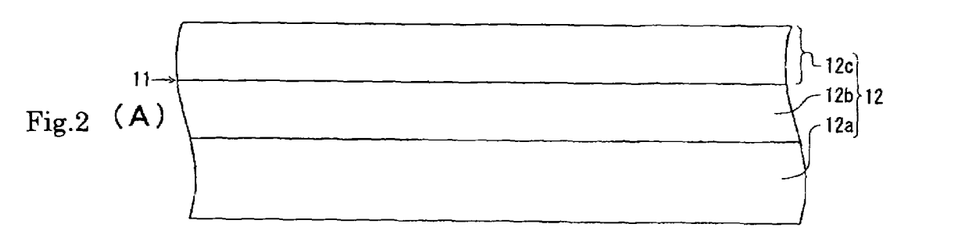
FIG. 2 is a process sectional view showing extracted major process steps of a method for manufacturing the semiconductor device according to the embodiment shown in FIG. 1.
Figure 3:
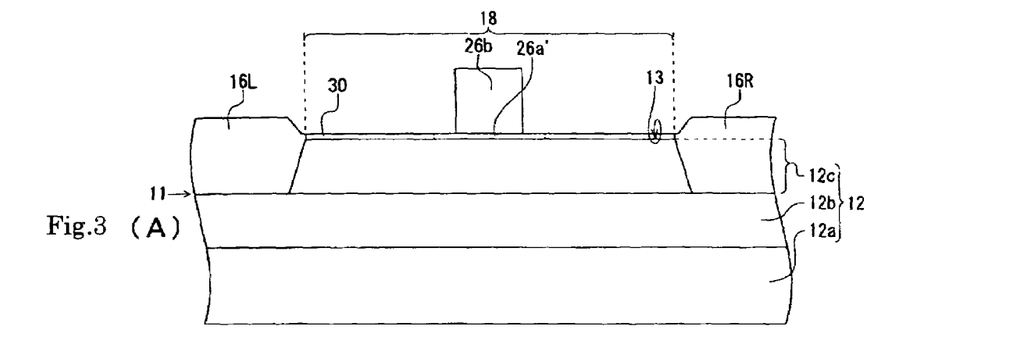
FIG. 3 is a process sectional view illustrating extracted major process steps of the method for manufacturing the semiconductor device according to the embodiment shown in FIG. 1.

A method for manufacturing the MOSFET 10 used as the semiconductor device will next be explained with reference to FIGS. 2 through 4.

As shown in FIG. 2(A), a substrate 12 is first prepared. More specifically, a substrate 12 is prepared wherein an $SiO_2$ layer 12b is interposed in sandwiched form between a base or bed substrate 12a and a p type semiconductor layer 12c by a known substrate laminating method or an SIMOX (Separation by Implanted Oxygen) method.

(First Process Step)

Next, a structure shown in FIG. 2(B), i.e., a structure in which a device forming area 18 is formed in the semiconductor layer 12c, is fabricated. More specifically, an $SiO_2$ film and an $Si_3N_4$ film are laminated on an estimated or predeterminate area or region in which the device forming area 18 is formed (not shown). Next, steam oxidization (about 1000° C.) added with steam is carried out with this $SiO_2/Si_3N_4$ laminated body as a mask to thereby form field oxide films 16L and 16R extending over the entire thickness of the semiconductor layer 12c in regions uncovered with the mask, of the semiconductor layer 12c, i.e., regions exposed from the mask. Thus, the device forming area 18 surrounded by the field oxide films 16L and 16R is defined. Thereafter, the $SiO_2/Si_3N_4$ laminated body used as the mask is removed by the known method, whereby such a structure as shown in FIG. 2(B) is obtained.

(Second Process Step)

Next, the substrate 12 formed with the device forming area 18 is placed in a thermal oxidation furnace and heated to a temperature of about 850° C. while diluted humidified oxygen is being added. Thus, a main surface 13 of the device forming area 18 is oxidized to form an about 2.5 nm-thick $SiO_2$ film 30, whereby such a structure as shown in FIG. 2(C) is obtained. Thereafter, in order to adjust the threshold voltage of the MOSFET 10, a second dopant (B) of the same conduction type as the semiconductor layer 12c is ion-implanted to a depth in the vicinity of the main surface 13 corresponding to the entire surface of the device forming area 18. Described more specifically, $BF_2+$ ions are ion-implanted at an implantation rate of about $1\times10^{12}$ $cm^{-2}$ and an implantation energy of 19 keV.

(Third Process Step)

Next, a structure shown in FIG. 3(A), i.e., a structure in which a gate electrode 26b is formed on the $SiO_2$ film 30, is fabricated. Described more specifically, an about 150 nm-thick polysilicon film (not shown) is deposited over the entire surface of the semiconductor layer 12c by an LPCVD (Low Pressure Chemical Vapor Deposition) method. Thereafter, a forming predeterminate area of the gate electrode 26b with respect to the polysilicon film is covered with an etching protective film (not shown) such as a photoresist. Afterwards, the corresponding gate electrode 26b is formed by performing the known etching. Of the $SiO_2$ film 30, one that exists in the forming predeterminate area of a gate electrode section 26 is now referred to as "a gate oxide film precursor 26a'". Finally, the etching protective film is removed to obtain such a structure as shown in FIG. 3(A).

Incidentally, a predeterminate area in which a source region 20 is formed, is referred to as "a source forming predeterminate area 20'" in the following description. Similarly, a predeterminate area in which a drain region 22 is formed, is referred to as "a drain forming predeterminate area 22'".

Further, a predeterminate area in which a body region 24 is formed, is referred to as "a body forming predeterminate area 24'".

(Fourth Process Step)

Next, such a process step as shown in FIG. 3(B) is performed. That is, Ar+ ions are ion-implanted in the device forming area 18 vertically to the substrate 12 at an implantation rate of about $2 \times 10^{14}$ cm$^{-2}$ and an implantation energy of 30 keV over the SiO$_2$ film 30 with the gate electrode 26b as a mask. In other words, the ion implantation of Ar is effected on the source forming predeterminate area 20' and the drain forming predeterminate area 22' including an end on the source region 20 side, of the body forming predeterminate area 24' and an end on the drain region 22 side, of the body forming predeterminate area 24'.

A projected range Rp of Ar ion-implanted in this condition is about 30 nm, and the implanted Ar has such a depth-direction concentration distribution that its concentration becomes maximum at the semiconductor layer 12c in the neighborhood of an interface 11 between the SiO$_2$ layer 12b and the semiconductor layer 12c.

Since a large quantity of crystal defects generally occur in the vicinity of the ion's projected range Rp upon ion implantation, the large quantity of crystal effects are introduced into the device forming area 18 in the vicinity of the interface 11 between the SiO$_2$ layer 12b and the semiconductor layer 12c by ion-implantation of Ar.

(Fifth Process Step)

Next, a structure shown in FIG. 3(C), i.e., a structure in which Ar ion-implanted regions 28 are formed in the device forming area 18, is fabricated. That is, high-temperature anneal is performed using an RTA (Rapid Thermal annealing) method to recover some of the crystal defects derived from the ion-implantation of Ar, thereby forming the corresponding Ar ion-implanted regions 28. Described more specifically, the device forming area 18 is caused to rise in temperature at about 80° C./sec from the current temperature, e.g., room temperature and then caused to reach a high-temperature anneal holding temperature of about 1050° C. even at the minimum temperature, followed by being held at this temperature for about 10 seconds. Accordingly, the rearrangement of silicon atoms displaced from lattice points due to collisions with the Ar ions occur in regions in which the crystal defects exist, and hence some of the crystal defects are recovered. Thus, the Ar ion-implanted regions 28 in which the crystal defects are artificially introduced, are formed in the neighborhood of the interface 11 of the device forming area 18, more accurately, in the vicinity of the interface 11 between the source and drain forming predeterminate areas 20' and 22'.

Here, a process step (corresponding to each of e.g., sixth and ninth process steps to be described later) for introducing the first dopant into the device forming area 18 does not exist between the ion implantation of Ar (fourth process step) and the high-temperature anneal (fifth process step). That is, the high-temperature anneal (fifth process step) is executed after the Ar ion implantation (fourth process step) without carrying out the introduction of the first dopant into the device forming area 18 (sixth and eighth process steps). The high-temperature anneal holding temperature (1050° C.) is set to an anneal temperature for activation of the first dopant to be described later, i.e., a temperature higher than an anneal holding temperature (ninth process step: 975° C.).

The above high-temperature anneal shares a process step for recovering some of the crystal defects and a process step for activating the second dopant (B) introduced into the device forming area 18 in the second process step. With the high-temperature anneal, a region placed directly below the gate electrode 26b, of a region in which the second dopant (B) introduced in the second process step is distributed, changes into a channel region 24a.

(Sixth Process Step)

Next, a structure shown in FIG. 4(A), i.e., a structure in which first ion-implanted regions 20b' and 22b' are formed in the device forming area 18, is fabricated. Incidentally, the first ion-implanted regions 20b' and 22b' respectively change into n$^-$ layers 20b and 22b by anneal (ninth process step) to be described later. Described more specifically, As+ ions corresponding to a first impurity of a conduction type (n type) opposite to the device forming area 18 (p type) are ion-implanted in the device forming area 18 vertically to the substrate 12 at an implantation rate of about $2 \times 10^{14}$ cm$^{-2}$ and an implantation energy of about 5 keV with the gate electrode 26b as a mask. Thus, the structure is obtained wherein the first ion-implanted regions 20b' and 22b' are formed in the neighborhood on the main surface 13 side, of the source and drain forming predeterminate areas 20' and 22'.

(Seventh Process Step)

Next, a structure shown in FIG. 4(B), i.e., a structure in which a gate electrode section 26 is provided on the main surface 13 in the device forming area 18, is obtained. Described more specifically, an about 80 nm-thick SiO$_2$ film (not shown) is deposited over the entire surface of the semiconductor layer 12c by a plasma CVD method. Thereafter, the SiO$_2$ film is anisotropically etched up to the surfaces of the source and drain forming predeterminate areas 20' and 22' by an RIE (Reactive Ion Etching) method. Thus, the SiO$_2$ film unsubjected to the etching remains so as to cover sidewalls of the gate electrode 26b, which serve as sidewalls 26c.

The SiO$_2$ film 30 having covered the regions other than the gate oxide film precursor 26a' is also removed by the anisotropic etching. That is, the SiO$_2$ film 30 that exists in the main surface 13 corresponding to the source and drain forming predeterminate areas 20' and 22' is also removed. As a result, the gate electrode section 26 provided with the gate oxide film 26a, gate electrode 26b and sidewalls 26c is formed on the main surface 13 in the device forming area 18.

(Eighth Process Step)

Next, a structure shown in FIG. 4(C), i.e., a structure is fabricated in which second ion-implanted regions 20a' and 22a' are formed in the device forming area 18. Incidentally, the second ion-implanted regions 20a' and 22a' respectively change into n$^+$ layers 20a and 22a by anneal to be described later (ninth process step). Described more specifically, P+ ions corresponding to a second impurity of a conduction type (n type) opposite to the device forming area 18 (p type) are ion-implanted in the device forming area 18 orthogonally to the substrate 12 at an implantation rate of about $5 \times 10^{15}$ cm$^{-2}$ and an implantation energy of about 6 keV with the gate electrode section 26 as a mask. Thus, the structure is obtained in which the second ion-implanted regions 20a' and 22a' are formed at depths deeper than the first ion-implanted regions 20b' and 22b' in the source and drain forming predeterminate areas 20' and 22'. Incidentally, in the present process step, the second impurity (P) is ion-implanted at an implantation rate higher than the first impurity (As) described in the sixth process step.

(Ninth Process Step)

Finally, the first and second impurities (As and P) introduced into the device forming area 18 in the sixth and ninth process steps are activated by anneal. Described more specifically, the device forming area 18 is caused to rise in temperature at about 60° C./sec and caused to reach an anneal holding temperature of about 975° C. even at the maximum temperature, followed by being held at this temperature for about 10 seconds. Thus, the first and second impurities are activated, so that the first ion-implanted regions 20b' and 22b' change into their corresponding n⁻ layers 20b and 22b, and the second ion-implanted regions 20a' and 22a' change into their corresponding n⁺ layers 20a and 22a. Here, the holding temperature (about 975° C.) for anneal in the present process step is set to a temperature lower than the holding temperature (about 1050° C.) for the high-temperature anneal in the fifth process step.

Thus, the MOSFET 10 (FIG. 1) is obtained wherein the crystal defects artificially introduced by ion-implantation of Ar are provided at the end on the source region 20 side, of the body region 24 and the end on the drain region 22 side, of the body region 24.

An off-leakage current and a substrate floating effect of the MOSFET 10 fabricated in this way will next be explained with reference to FIG. 5.

FIG. 5 shows the relationship between a drain current Id (vertical axis) of the MOSFET 10 and a gate voltage Vg (horizontal axis) thereof. FIG. 5 is obtained by effecting measurements similar to FET1 through FET3 (refer to "problems to be solved by the invention") on the MOSFET 10. Thus, the vertical and horizontal axes of FIG. 5 are similar to FIG. 7. Nine graphs drawn in FIG. 5 also correspond to variations in drain voltage Vd (V) similar to FIG. 7.

According to FIG. 5, an off-leakage current $Id_{off}$ (Id at Vg=0V) of the MOSFET 10 at Vd=3.3V is about 0.4 pA and less than or equal to 1 pA.

The maximum value $Vg_{max}$ of the gate voltage Vg at Id=0.1 µA can be read as about 0.7V from the graph of Vd=0.1V. The minimum value $Vg_{min}$ of the gate voltage Vg at Id=0.1µA can be read as about 0.3V from the graph of Vd=3.3V. Thus, a difference $\Delta Vg$ (= $Vg_{max}$ - $Vg_{min}$) between the maximum value $Vg_{max}$ and the minimum value $Vg_{min}$ is about 0.4V.

Here, results obtained by comparing off-leakage currents $Id_{off}$ of the MOSFET 10 and FET1 through FET3 and $\Delta Vg$ thereof are shown in Table 1 depicted below together with characteristic points of their manufacturing processes.

$Id_{off}$ and $\Delta Vg$ of the MOSFET 10 indicate satisfactory values in good balance.

That is, the off-leakage current Idoff of the MOSFET 10 indicates a value slightly better than FET1 estimated to be minimum in crystal defect since the ion implantation of Ar is not carried out. Further, since the implantation rate of Ar is large, $\Delta Vg$ of the MOSFET 10 indicates a value near FET2 estimated to be most suppressed in substrate floating effect.

In the method for manufacturing the semiconductor device according to the present embodiment in this way, the recovery of some of the crystal defects derived from the Ar ion implantations and the activation of the first dopant both simultaneously done at one anneal are respectively carried out in discrete process steps (fifth and ninth process steps) in the case of FET2 and FET3. Thus, since the first and second impurities (As and P) are not yet introduced in the device forming area 18 in the fifth process step for recovering some of the crystal defects, there is no fear of excessive diffusion of the first and second impurities along the gate-length direction, and the high-temperature anneal (about 1050° C.) can be carried out at the optimum temperature for recovering some of the crystal defects.

In the ninth process step for activating the first and second impurities, some of the crystal defects have been recovered by the high-temperature anneal (fifth process step). Thus, the crystal defects equivalent to a quantity necessary and enough simply to suppress the substrate floating effect and reduce the off-leakage current already exist in the device forming area 18. Thus, in the ninth process step, anneal can be carried out at the optimum temperature (about 975° C.) enabling the activation of the first dopant while the distance of diffusion of each of the first and second impurities along the gate-length direction is being reduced, without taking into consideration recovery of the crystal defects.

Thus, according to the method for manufacturing the semiconductor device according to the present embodiment, the semiconductor device (MOSFET 10) can be obtained which is capable of suppressing the substrate floating effect and the off-leakage current at practically sufficient levels in good balance simultaneously while reducing a short channel effect. Accordingly, when the MOSFET 10 is used in an integrated

TABLE 1

| | Process 1 -> | Process2 -> | Process 3 -> | Process 4 | characteristic | |
|---|---|---|---|---|---|---|
| | Ar implantation | high-temperature anneal | dopant implantation | anneal | off-leakage current (PA) | ΔVg (V) |
| MOSFET10 | 2 × 10¹⁴ | 1050 | Yes | 975 | abt 0.4 | abt 0.4 |
| FET1 | No | No | Yes | 975 | abt 0.5 | abt 0.6 |
| FET2 | 2 × 10¹⁴ | No | Yes | 975 | abt 6 | abt 0.3 |
| FET3 | 5 × 10¹³ | No | Yes | 975 | abt 3 | abt 0.5 |

Note 1):
Numerical value in the "Ar implantation" column indicates an implantation rate (cm⁻²) of Ar.
Note 2):
Numerical values in the "high-temperature anneal" and "anneal" columns respectively indicate a temperature (° C.).

It is understood that when the MOSFET 10 subjected to high-temperature anneal (Table 1: process 2) without being subjected to ion implantation (Table 1: process 3) of the first dopant after ion implantation of Ar (Table 1: process 1) is compared with FET1 through FET3, the off-leakage current circuit as each of an I/O transistor for a peripheral circuit to which a relatively high voltage (≈3.3V) is applied, and a transistor for an analog circuit, power consumption can be reduced and a source-drain breakdown voltage can be enhanced.

Further, in the MOSFET 10 manufactured by the method for manufacturing the semiconductor device according to the present embodiment, the off-leakage current $Id_{off}$ is less than or equal to about 1 pA and the index $\Delta Vg$ indicative of the magnitude of the substrate floating effect is less than or equal to about 0.4V. That is, the MOSFET 10 formed in the substrate 12 (SOI substrate) attains the suppression of the substrate floating effect and the reduction in off-leakage current simultaneously at the practically sufficient levels in good balance regardless of the provision of the crystal defect regions 28b defined as the recombination centers artificially introduced in the body region 24.

With the execution of the high-temperature anneal (fifth process step) at a temperature of 1050° C. or higher, the crystal defects derived from the ion implantation of Ar can be recovered up to the degree that the reduction in the off-leakage current ($Id_{off}$) and the suppression of the substrate floating effect ($\Delta Vg$) can be attained simultaneously, without the fear of excessive diffusion of the first dopant (As and P) along the gate-length direction. Further, since the diffusion of the first dopant (As and P) along the gate-length direction can be suppressed with execution of the anneal (ninth process step) at 975° C. or less, the short channel effect can be suppressed.

That is, the high-temperature anneal does not exert adverse effects (such as the short channel effect, etc.) on the formation of the source and drain regions 20 and 22 by virtue of execution of the recovery (high-temperature anneal) of the crystal defects and the activation of the first dopant (anneal) in the discrete process steps.

By executing the high-temperature anneal (fifth process step), so-called RTA for making the rise in temperature at the abrupt temperature rise rate like 60° C. to 80° C./sec, the diffusion of silicon atoms to a long distance is suppressed in the regions containing the crystal defects formed by the ion implantation of Ar (fourth process step). That is, the silicon atoms displaced from the lattice points contribute to the recovery of the crystal defects in the neighborhood of their atoms without being diffused far off. This means that the recovery of the crystal defects progresses with regions (hereinafter called "recovery unit regions") each corresponding to the magnitude of a diffusion length or distance range of each silicon atom as units. Secondary defects such as dislocations occur at a boundary portion between the recovery unit regions adjacent to each other. Since impurities in crystals generally have such properties that they locally exist in the crystal defects, the diffused Ar atoms are principally fetched into the secondary defects.

On the other hand, since the conventional anneal slower in the temperature rise rate than RTA is larger in the diffusing length of the silicon atom than RTA, the size of each individual recovery unit region becomes larger than that in the case of RTA. That is, the conventional anneal becomes fewer in the number of recovery unit regions than RTA. Thus, the quantity of secondary defects generated at the boundary between the adjacent recovery unit regions becomes smaller than that in the case of RTA. Further, the conventional anneal becomes longer than RTA in the diffusion length of each Ar atom. Owing to a synergistic effect between them, the number (concentration) of Ar atoms fetched into the individual secondary defects becomes very high in the conventional anneal. As a result, the Ar atoms are segregated into the secondary defects in a concentrated manner and degrade the characteristic of the MOSFET 10.

Thus, the excessive segregation of Ar into the secondary defects is suppressed by execution of the high-temperature anneal (fifth process step) at the temperature rise rate of 60° C. to 80° C./sec, whereby the MOSFET 10 good in characteristic can be obtained.

Incidentally, the upper limit value 80° C./sec of the suitable temperature rise rate (60° C. to 80° C./sec) is limited by specs of an RTA apparatus. It is expected that due to the above reasons, the density of each secondary defect in the crystal defect region 28b will also increase as the temperature rise rate becomes large. Accordingly, it is estimated that the larger the temperature rise rate, the more the segregation of Ar atoms into the secondary defects can be avoided. Thus, it is estimated that the true upper limit value of the temperature rise rate will probably be 80° C./sec or higher (e.g., 100° C./sec). If the temperature rise rate is less than 60° C./sec, then the segregation of Ar into the secondary defects becomes pronounced and the characteristic of the MOSFET 10 is degraded. This is therefore undesirable.

With the setting of the temperature rise rate at the high-temperature anneal (fifth process step) to 60° C. to 80° C./sec, the time required to reach the high-temperature anneal holding temperature (1050° C.) can be shortened to a few tens of seconds or so. Further, since the holding time at the high-temperature anneal holding temperature ranges from 10 seconds to 30 seconds, the time necessary for the high-temperature anneal can be suppressed to within one minute. Thus, throughput at the high-temperature anneal (fifth process step) can be enlarged.

Ar is ion-implanted (fourth process step) in such a manner that the concentration of Ar reaches the maximum in the semiconductor layer 12c in the neighborhood of the interface 11 between the $SiO_2$ layer 12b and the semiconductor layer 12c. Consequently, the crystal defects are generated in the crystal defect regions 28b so as to be densely placed in the vicinity of the interface 11. On the other hand, the holes generated by impact ionization have such properties that they move along the neighborhood of the interface 11. Thus, providing the crystal defects in the crystal defect regions 28b so as to be densely placed in the neighborhood of the interface 11 makes it possible to effectively put the holes in the crystal defects and recombine them.

By executing ion-implantation of Ar at the implantation rate ranging from $2 \times 10^{14}$ cm$^{-2}$ to $5 \times 10^{14}$ cm$^{-2}$ and thereafter executing the high-temperature anneal at 1050° C. or higher (fifth process step) without introduction of the first dopant (As and P), the reduction in off-leakage current ($Id_{off}$) of the MOSFET 10 and the suppression of the substrate floating effect ($\Delta Vg$) can be attained simultaneously.

Incidentally, although the ion-implantation rate of Ar in the fourth process step is set to $2 \times 10^{14}$ cm$^{-2}$ in the present embodiment, the ion-implantation rate of Ar can be selected to an arbitrary and suitable rate corresponding to the design within a range from $2 \times 10^{14}$ cm$^{-2}$ to $5 \times 10^{14}$ cm$^{-2}$. When the ion-implantation rate is less than $2 \times 10^{14}$ cm$^{-2}$, although depending upon the condition of the subsequent high-temperature anneal (fifth process step), the absolute quantity of each crystal defect introduced into the semiconductor layer 12c is small. Therefore, even though the condition of the high-temperature anneal is relaxed (the holding temperature is reduced and the holding time is shortened), the substrate floating effect ($\Delta Vg$) cannot be suppressed. This case is therefore undesirable. Even though the condition of the high-temperature anneal is stepped up (the holding temperature is caused to rise and the holding time is made long) where the ion-implantation rate is larger than $5 \times 10^{14}$ cm$^{-2}$, the crystal defects are not recovered sufficiently and the off-leakage current $Id_{off}$ becomes large. This case is therefore undesirable.

The high-temperature anneal holding temperature may preferably range from over 1050° C. to under 1100° C. When the high-temperature anneal holding temperature is less than 1050° C., the crystal defects introduced by the ion-implantation of Ar are not recovered sufficiently and hence the off-leakage current $Id_{off}$ increases. This case is therefore undesirable.

If the temperature rise rate at the high-temperature anneal (fifth process step) ranges from 60° C./sec to 80° C./sec, then the high-temperature anneal holding temperature and the holding time may preferably be set to such conditions that the MOSFET 10 exhibits satisfactory characteristics ($Id_{off}$: small and $\Delta Vg$: small) in consideration of the ion-implantation rate of Ar. It is generally desirable to execute one or both of (1) an increase in the high-temperature anneal holding temperature and (2) prolongation of the holding time where the ion-implantation rate of Ar is increased.

In the present embodiment, the high-temperature anneal (fifth process step) was carried out at the high-temperature anneal holding temperature of 1050° C. and in the holding time of 10 seconds. However, the high-temperature anneal holding temperature and the holding time are not necessarily limited to these values. For example, under the high-temperature anneal condition in the present embodiment, the MOSFET 10 indicates practically sufficient satisfactory characteristics ($Id_{off}$: small and $\Delta Vg$: small) if the high-temperature anneal holding time ranges from 10 seconds to 30 seconds. When the high-temperature anneal holding temperature is set to a temperature (e.g., about 1100° C.) higher than 1050° C., a MOSFET 10 having satisfactory characteristics can be obtained even though the holding time is set to a short time (e.g., about 5 seconds) correspondingly.

A low-temperature anneal temperature may preferably be 975° C. or less. When the low-temperature anneal temperature is higher than 975° C., the first and second impurities (As and P) are excessively diffused in the gate-length direction and the short channel effect becomes pronounced in the MOSFET 10. This is therefore undesirable.

Although the ion-implantation energy of Ar is set to 30 keV in the present embodiment, it is implantation energy most suited for a 40 nm-thick semiconductor layer 12c. Thus, when the thickness of the semiconductor layer 12c is changed, it is desirable to change the implantation energy correspondingly and take such a depth-direction concentration distribution that the concentration of Ar becomes maximum at the semiconductor layer 12c in the neighborhood of the interface 11 between the SiO$_2$ layer 12b and the semiconductor layer 12c.

Although Ar is ion-implanted from the direction orthogonal to the substrate 12 in the present embodiment, Ar may be ion-implanted from the direction that tilts to the substrate 12.

Although the present embodiment illustrates the n channel type MOSFET 10 as an example, a p channel type MOSFET also brings about operative effects similar to the n channel type MOSFET 10. That is, the off-leakage current can be reduced and at the same time the substrate floating effect can be suppressed.

Although the present embodiment illustrates, as an example, the case in which the SOI substrate is used as the substrate 12, for example, an SOS (Silicon On Sapphire) substrate or an SOQ (Silicon On Quartz) substrate may be used as the substrate 12.

Although the case in which the n⁻ layers 20b and 22b are formed as the LDD structure, is illustrated in the MOSFET 10 of the present embodiment and its manufacturing method, there is no need to provide the n⁻ layers 20b and 22b if the generation of hot carriers can be suppressed in the neighborhood of the drain region 22.

Even when elements of one type or more selected from a group constituted of 0-group elements, Si and Ge other than Ar are ion-implanted as an alternative to Ar, a reduction in off-leakage current $Id_{off}$ of an obtained MOSFET 10 and suppression of a substrate floating effect $\Delta Vg$ can be attained simultaneously.

Although only the MOSFET 10 is illustrated as the semiconductor device in the present embodiment, the semiconductor device mentioned in the present invention means a concept that contains an integrated circuit in which the MOSFET 10 is provided as one elemental device.

While the preferred forms of the present invention have been described, it is to be understood that modifications will be apparent to those skilled in the art without departing from the spirit of the invention. The scope of the invention is to be determined solely by the following claims.

What is claimed is:

1. A method for manufacturing a semiconductor device configured as a MOS field effect transistor provided with a source region and a drain region formed by activating, through anneal, a first dopant of other conduction type ion-implanted in a device forming area of one conduction type provided in a semiconductor layer formed over an insulator, and a body region corresponding to the device forming area between the source region and the drain region, said method comprising the steps of, prior to the ion-implantation of the first dopant,
    (a) performing ion implantation of Ar in a boundary region between the source and drain regions to be formed, which corresponds to a region lying in a predeterminate area for forming the body region; and
    (b) performing high-temperature anneal for partly recovering crystal defects produced by the ion implantation of the Ar at a temperature higher than the anneal for activation of the first dopant,
    wherein the high-temperature anneal is carried out at a high-temperature anneal holding temperature that ranges from 1050° C. to 1100° C., and the anneal for activation of the first dopant is carried out at an anneal holding temperature that ranges from 950° C. to 975° C.

2. The method according to claim 1, wherein upon the high-temperature anneal, a rise in temperature is performed up to the high-temperature anneal holding temperature at a temperature rise rate that ranges from 60° C./sec to 80° C./sec.

3. The method according to claim 1, wherein the Ar is ion-implanted at such implantation energy that the concentration thereof becomes maximum at the semiconductor layer in the neighborhood of an interface between the insulator and the semiconductor layer.

4. The method according to claim 1, wherein the Ar is ion-implanted at an implantation rate which ranges from $2 \times 10^{14} cm^{-2}$ to $5 \times 10^{14} cm^{-2}$.

5. The method according to claim 1, wherein ions of elements of one type or more selected from a group constituted of 0-group elements, Si and Ge other than the Ar are ion-implanted as an alternative to the Ar.

6. The method according to claim 1, wherein one type of substance selected from a group constituted of SiO$_2$, a sapphire and a crystal is used as the insulator.

7. A method for manufacturing a semiconductor device configured as a MOS field effect transistor in a device forming area of one conduction type provided in a semiconductor layer formed over an insulator, said method comprising:
    an Ar ion implantation step for ion-implanting Ar with a gate electrode section formed in a surface of the device forming area as a mask to introduce crystal defects into the device forming area, said step being used as a preprocess for introducing a first dopant of other conduction type into the device forming area of one conduction type;

a high-temperature anneal step for recovering some of the crystal defects;

a first ion implantation step for ion-implanting the first dopant of other conduction type with the gate electrode section as a mask; and an activation step for performing anneal for activation of the first dopant at a temperature lower than the high-temperature anneal to thereby form a source region and a drain region in the device forming area, whereby the MOS field effect transistor having the crystal defects is formed at both an end on the source region side, of a body region corresponding to the device forming area between the source region and the drain region and an end on the drain region side, of the body region.

8. The method according to claim 7, wherein a step for forming field oxide films for electrically isolating said individual MOS field effect transistors to be formed, in the semiconductor layer, a second ion implantation step for ion-implanting a second dopant of said one conduction type in the device forming area to adjust a threshold voltage of said each MOS field effect transistor, and a step for laminating a gate oxide film and a gate electrode over the surface of the device forming area demarcated by the field oxide films in this order to thereby form the gate electrode section are executed prior to the Ar ion implantation step, and wherein the first ion implantation step includes, a first-time ion implantation step for ion-implanting a first impurity to a depth near the surface of the device forming area as the first dopant using the gate electrode as a mask, a step for forming sidewalls on sidewalls of the gate electrode, and a second-time ion implantation step for ion-implanting a second impurity identical to or different from the first impurity to a depth deeper than that at the first impurity as the first dopant using the gate electrode and the sidewalls as masks.

9. The method according to claim 7, wherein the high-temperature anneal is carried out at a high-temperature anneal holding temperature that ranges from 1050° C. to 1100° C., and the anneal for activation of the first dopant is carried out at an anneal holding temperature that ranges from 950° C. to 975° C.

10. The method according to claim 9, wherein upon the high-temperature anneal, a rise in temperature is performed up to the high-temperature anneal holding temperature at a temperature rise rate that ranges from 60° C./sec to 80° C./sec.

11. The method according to claim 7, wherein the Ar is ion-implanted at such implantation energy that the concentration thereof becomes maximum at the semiconductor layer in the neighborhood of an interface between the insulator and the semiconductor layer.

12. The method according to claim 7, wherein the Ar is ion-implanted at an implantation rate which ranges from $2 \times 10^{14} cm^{-2}$ to $5 \times 10^{14} cm^{-2}$.

13. The method according to claim 7, wherein ions of elements of one type or more selected from a group constituted of 0-group elements, Si and Ge other than the Ar are ion-implanted as an alternative to the Ar.

14. The method according to claim 7, wherein one type of substance selected from a group constituted of $SiO_2$, a sapphire and a crystal is used as the insulator.

* * * * *